United States Patent

Mahant-Shetti et al.

[11] Patent Number: 5,951,711
[45] Date of Patent: Sep. 14, 1999

[54] METHOD AND DEVICE FOR DETERMINING HAMMING DISTANCE BETWEEN TWO MULTI-BIT DIGITAL WORDS

[75] Inventors: Shivaling S. Mahant-Shetti, Richardson, Tex.; Vivek G. Pawar, Bangalore, India

[73] Assignee: Texas Instruments Incorporated, Dallas, Tex.

[21] Appl. No.: 08/176,867

[22] Filed: Dec. 30, 1993

[51] Int. Cl.$^6$ ............................ G06F 11/10; H03M 13/12
[52] U.S. Cl. .................... 714/795; 714/796; 375/262; 375/341; 340/146.2; 326/52
[58] Field of Search .................. 371/30, 43; 364/728.03, 364/715.09, 604, 773; 340/146.2; 714/752, 777, 794, 795, 796; 375/262, 341; 326/52

[56] References Cited

U.S. PATENT DOCUMENTS

| | | | |
|---|---|---|---|
| 2,885,149 | 5/1959 | Clapper | 364/773 |
| 3,656,109 | 4/1972 | Conway | 340/146.2 |
| 4,119,946 | 10/1978 | Taylor | 340/146.3 Q |
| 5,046,019 | 9/1991 | Basehore | 364/513 |
| 5,148,431 | 9/1992 | Hayashi | 371/30 |
| 5,218,562 | 6/1993 | Basehore et al. | 364/728.03 |
| 5,272,657 | 12/1993 | Basehore et al. | 364/728.03 |

OTHER PUBLICATIONS

Selviah, D.R. et al; Extension of the Hamming Neural Network to a Multilayer Architecture for Optical Implementation; Artificial Neural Networks, 1989.

*Primary Examiner*—Emmanuel L. Moise
*Attorney, Agent, or Firm*—Carlton H. Hoel; W. James Brady; Richard L. Donaldson

[57] ABSTRACT

A Hamming distance calculation device (10) includes a bit comparator (12) for determining nonmatching bit positions between two digital words. A current signal is generated for each nonmatching bit position by a nonmatching current generator (14). The current signals created are combined to produce a summed current signal that drives a first reference current comparator (18), a second reference current comparator (20), and an nth reference current comparator (22). The first reference current comparator (18) compares the summed current signal with a reference current signal to produce an output and a select signal that determines a reference current signal used in the second reference current comparator (20). The second reference current comparator (20) compares the summed current signal with a reference current signal as selected by the first reference current comparator (18) and produces an output in response thereof. The Nth reference current comparator (22) compares the summed current signal with a reference current signal as selected by the previous reference current comparator (20) and produces an output in response thereof. Each reference current comparator provides an output that collectively establish a digital output word indicating the Hamming distance between the two input digital words.

17 Claims, 3 Drawing Sheets

METHOD AND DEVICE FOR DETERMINING HAMMING DISTANCE BETWEEN TWO MULTI-BIT DIGITAL WORDS

TECHNICAL FIELD OF THE INVENTION

The present invention relates in general to microelectronic device implementations and more particularly to a method and device for determining Hamming distance between two multi-bit digital words.

BACKGROUND OF THE INVENTION

A Hamming distance is a measurement of two digital words indicating the number of bit positions that have differing values between the two digital words. Hamming distance calculations are useful as a distance measure in applications such as Viterbi decoding. In such applications, the accuracy of the Hamming distance calculation can decrease as the number of differing bit positions increases. For a Hamming distance calculation of large digital words, such as 24 bits in length, the result only needs to be accurate when the number of different bits is small and can saturate after the count of differing bits exceeds, for example, 8.

With such a specification, a pure digital implementation of a Hamming distance algorithm requires 24 3-bit saturating half-adders in each of the 24 stages. If carry look ahead methods are not used, the digital implementation would require carry propagate circuitry of 72 stages. The resulting pure digital implementation would thus be area inefficient as well as slow in operation.

Traditional analog Hamming distance calculation devices use a comparator to compare an input voltage signal to a reference voltage signal at a specific first clock cycle. A difference voltage signal is established and amplified. The difference voltage signal is applied to the comparator at a second clock signal. This process is repeated until the Hamming distance is determined. However, the traditional analog-to-digital device with successive approximation approach is limited by how fast the comparator can be clocked and how much setting time is required for the comparator. Also, a high precision comparator is needed to operate in conjunction with proper clocking requirements. Therefore, it is desirable to perform a Hamming distance calculation in a more device efficient and timely manner.

SUMMARY OF THE INVENTION

From the foregoing, it may be appreciated that a need has arisen for a method and device for determining a Hamming distance with a minimal amount of stages. A need has also arisen for an accurate Hamming distance calculation for a small number of different bits between two digital words.

In accordance with the present invention, a method and device for determining a Hamming distance are provided which substantially eliminate or reduce disadvantages and problems associated with conventional digital implementation techniques.

According to an embodiment of the present invention, there is provided a device for determining a Hamming distance that includes a bit comparator for determining nonmatching bit positions between two multi-bit digital words. A current generator generates a current signal for each nonmatching bit position and sums the current signals of each nonmatching bit position, resulting in a summed current signal. A plurality of reference current comparators successively compare the summed current signal with a plurality of reference current signals corresponding to the reference current comparators. A current mode analog-to-digital converter converts the outputs of the reference current comparators into a digital representation of the Hamming distance between the two multi-bit digital words.

The method and device of the present invention provide various technical advantages over conventional digital implementation techniques. For example, one technical advantage is in reducing the number of stages as required in the pure digital implementation. Another technical advantage is in providing an accurate Hamming distance calculation for small variations between the two digital words. Yet another technical advantage is in increasing the speed and efficiency of a Hamming distance calculation device. Still another technical advantage is in having a low resolution Hamming distance calculation device that does not require a great deal of accuracy for implementation in a digital process. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
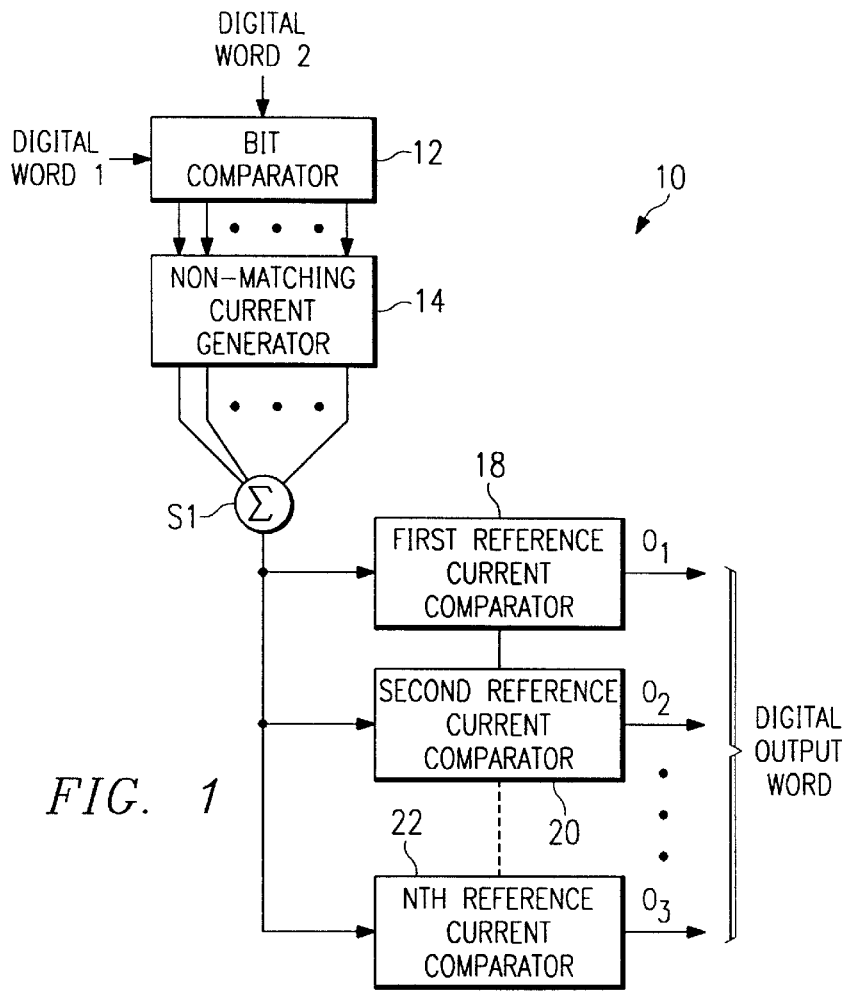
FIG. 1 illustrates a block diagram of a Hamming distance calculation device.

FIG. 1 is a block diagram of a Hamming distance calculation device 10. Hamming distance calculation device 10 includes a bit comparator 12 that receives a digital word 1 and a digital word 2. A nonmatching current generator 14 creates a current signal for all nonmatching bit positions indicated by bit comparator 12 and creates a sum of all generated current signals at summing node S1. The resulting output of summing node S1, a summed current signal, is fed to a first reference current comparator 18, a second reference current comparator 20, up to an Nth reference current comparator 22 depending on the accuracy desired for device 10. Each reference current comparator defines a threshold stage that produces an output corresponding to a portion of the Hamming distance value. The outputs $O_1$, $O_2$, and $O_3$ of each reference current comparator 18, 20, and 22 are a digital representation of the Hamming distance between digital word 1 and digital word 2.

In operation, digital word 1 and digital word 2 are compared by bit comparator 12 to determine which bit positions do not match between the two digital words. For each nonmatching bit position determined by bit comparator 12, a current signal is generated by nonmatching current generator 14. Summing node S1 combines the current signals for the nonmatching bit positions into a summed current signal that drives first reference current comparator 18, second reference current comparator 20, up to Nth reference current comparator 22. The summed current signal includes an offset value inherently created in the circuitry in order to make accurate threshold comparisons within each threshold stage.

First reference current comparator 18 compares the summed current signal with a reference current signal that is a multiple of an individual current signal created by nonmatching current generator 14. First reference current comparator 18 produces an output according to whether the summed current signal is less than or greater than the reference current signal.

Second reference current comparator 20 compares the summed current signal with a reference current signal that is a multiple of a current signal generated by nonmatching current generator 14 as selected by first reference current comparator 18. Second reference current comparator 20 produces an output according to whether the summed current signal is greater than or less than the selected reference current signal.

Similarly, Nth reference current comparator 22 compares the summed current signal from summer 16 with a selected reference current signal that is a multiple of a current signal from nonmatching current generator 14 as determined by the results of second reference current comparator 20. Nth reference current comparator 22 produces an output according to whether the summed current signal is greater than or less than the selected reference current signal. Analog-to-digital converter 24 receives the outputs of each reference current comparator and converts these outputs into an appropriate digital output word indicating the Hamming distance between digital word 1 and digital word 2. Successive threshold determinations of the summed current signal are made by the reference current comparators in order to pinpoint the current level of the summed current signal for creation of the appropriate Hamming distance digital output word.

Figure 2:
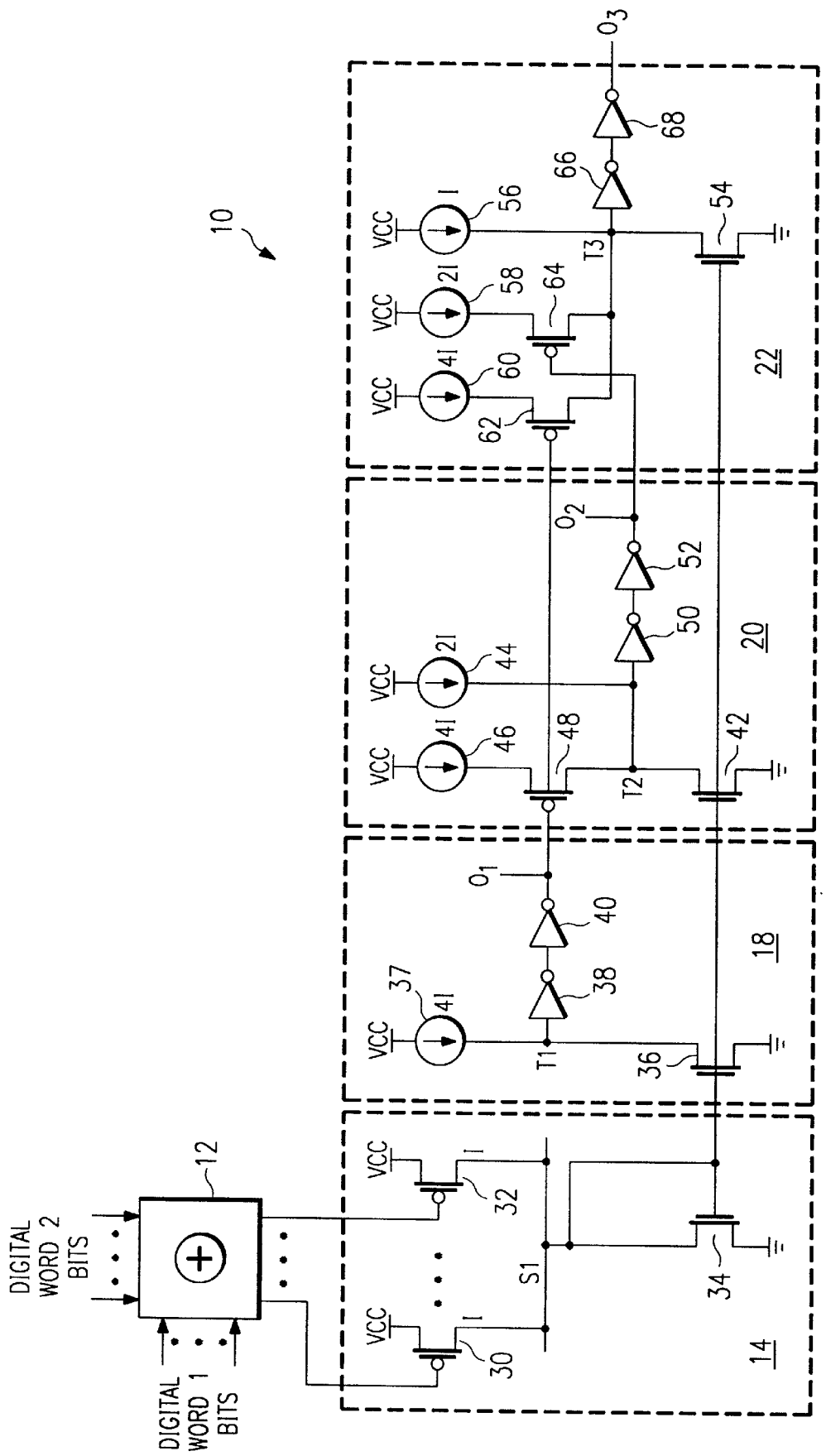
FIG. 2 illustrates a simplified schematic diagram of the Hamming distance calculation device.

FIG. 2 is a simplified schematic diagram of a 3 bit Hamming distance calculation device 10. Device 10 includes bit comparator 12 that performs an exclusive-or operation on each bit position between digital word 1 and digital word 2. The exclusive-or operation is performed by a transistor circuit well known by those skilled in the art. Nonmatching current generator 14 creates a current signal for each nonmatching bit position as determined by bit comparator 12 through transistors 30–32. Current signals for each nonmatching bit position are summed at summing node S1 and connected to the drain of transistor 34.

First reference current comparator 18 receives the summed current signal at current mirror transistor 36 and compares it to a reference current signal of 4I from a reference current signal source 37. The result of the comparison is buffered through inverters 38 and 40.

Second reference current comparator 20 receives the summed current signal at a current mirror transistor 42 and compares it to either a reference current signal of 2I from reference signal source 44 or with a reference current signal of 6I from a combination of a reference signal source 44 and a reference signal source 46 as determined by the output of first reference current comparator 18 through transistor 48. The result of this comparison is buffered through inverters 50 and 52 to produce output $O_2$.

Third reference current comparator 22 receives the summed current signal through current mirror transistor 54 and compares it to either a reference current signal of I from a reference signal source 56, a reference current signal of 3I from a combination of a reference signal source 56 and a reference signal source 58, a reference current signal of 5I from a combination of a reference signal source 56 and a reference signal source 60, or a reference current signal of 7I from a combination of a reference signal source 56, a reference signal source 58, and a reference signal source 60 as determined by outputs $O_1$ and $O_2$ of first reference current comparator 18 and second reference current comparator 20 at transistors 62 and 64, respectively. The result of the comparison is buffered through inverters 66 and 68 to produce output $O_3$. Though not shown, outputs $O_1$, $O_2$, and $O_3$ are inverted to produce the digital output word indicating the Hamming distance.

In operation, transistors 30–32 of nonmatching current generator 14 create a current signal I for each nonmatching bit position as determined by the exclusive-or operation of bit comparator 12. The current signals are combined into a summed current signal at summing node S1 and applied to each reference current comparator through transistor mirrors 34, 36, 42, and 54. An offset is included in the summed current signal in order that appropriate threshold determinations can be made with each reference current comparator.

First reference current comparator 18 compares the summed current signal with reference current signal 4I from reference signal source 37, a multiple of a current signal created for each nonmatching bit position at node T1. Node T1 is at a high level state when the summed current signal is less than the reference signal source, otherwise node T1 is at a low level state. The resulting signal at node T1 is buffered by inverters 38 and 40 to create output $O_1$.

In second reference current comparator 20, output $O_1$ of first reference current comparator 18 is used to select the reference signal sources for comparison with the summed current signal. Transistor 42 of second reference current comparator 20 receives the summed current signal and compares it to either reference current signal 2I from reference signal source 44 or reference current signal 6I from a combination of reference signal source 44 and reference signal source 46 as determined by output $O_1$ and activated by transistor 48 at node T2. Node T2 is at a high level state when the summed current signal is less than the selected reference current signal and at a low level state when the summed current signal is higher than the selected reference current signal. Inverters 50 and 52 buffer the signal at node T2 to create output $O_2$.

Outputs $O_1$ and $O_2$ are used to select the appropriate reference signal sources providing the reference current signal for third reference current comparator 22. Transistor 54 of third reference current comparator 22 receives the summed current signal and compares it with either reference current signal I from reference signal source 56, reference current signal 3I from a combination of reference signal source 56 and reference signal source 58, reference current signal 5I from a combination of reference signal source 56 and reference signal source 60, or reference current signal 7I from a combination of reference signal source 56, reference signal source 58, and reference signal source 60, at node T3. Node T3 is at a high level state when the summed current signal at transistor 54 is less than the selected reference current signal and at a low level state when the summed current signal is greater than the selected reference current signal. The resulting signal at node T3 is buffered by inverters 66 and 68 to produce output $O_3$.

Figure 3:
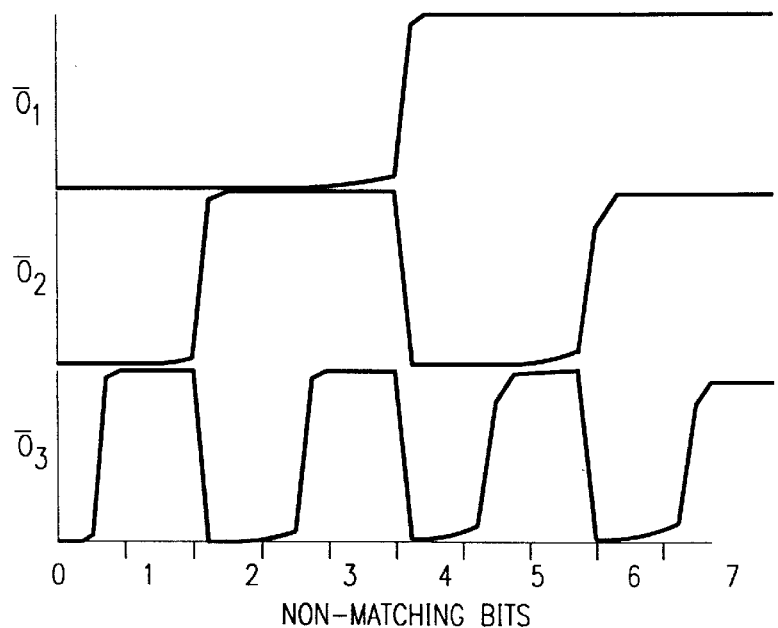
FIG. 3 illustrates a graphical simulation of the outputs of each stage of the Hamming distance calculation device.

FIG. 3 is a graphical representation of outputs $O_1$, $O_2$, and $O_3$ showing the digital representation for each number of nonmatching bit positions after inversion. Consider a specific example of three nonmatching bit positions as determined by bit comparator 12. A current signal I is generated by nonmatching current generator 14 for each of the three nonmatching bit positions. The currents are combined to produce a summed current signal of 3I (plus an offset value to make accurate threshold comparisons). At first reference current comparator 18, the summed current signal of 3I is compared to reference current signal 4I from reference signal source 37 at node T1. Since the summed current signal is less than the reference current signal, node T1 is at a high level state resulting in a high level state at output $O_1$.

At second reference current comparator 20, a high level state at output $O_1$ turns off transistor 48 leaving the summed current signal of 3I to be compared with reference current signal 2I from reference signal source 44 at node T2. Since the summed current signal is greater than the selected reference current signal, node T2 is at a low level state resulting in a low level state at output $O_2$.

At third reference current comparator 22, the high level state of output $O_1$ turns off transistor 62 and the low level state of output $O_2$ turns on transistor 64. At node T3, the summed current signal 3I is compared to reference current signal 3I from the combination of reference signal source 56 and reference signal source 58. Since the summed current signal is greater than the combined reference current signal due to the offset included in the summed current signal, node T3 is at a low level state resulting in a low level state at output $O_3$. After inversion, outputs $\overline{O}_1$, $\overline{O}_2$, and $\overline{O}_3$ have the value 011 as shown in the graph.

Figure 4:
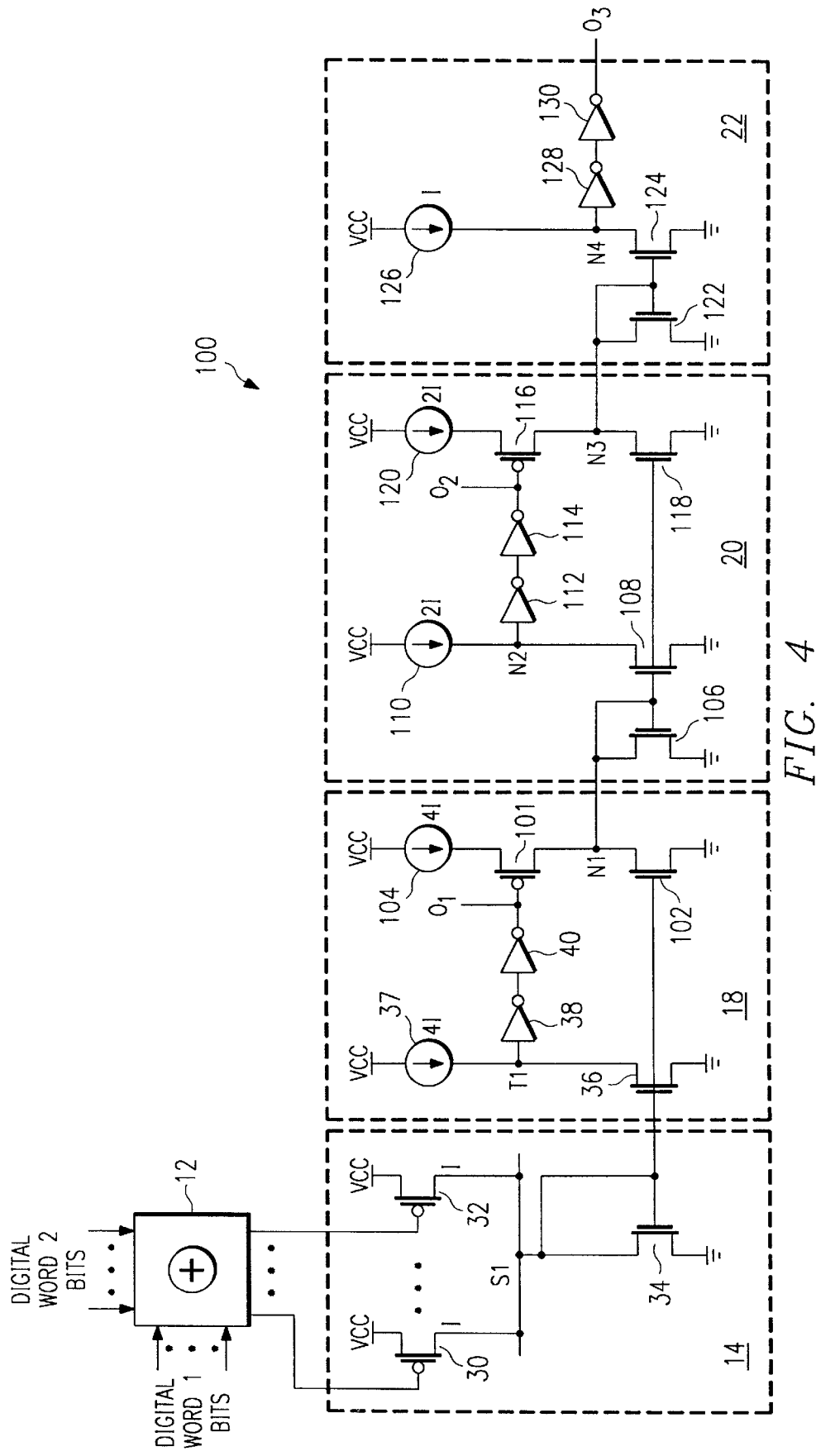
FIG. 4 illustrates a schematic diagram of an alternative Hamming distance calculation device.

The embodiment of FIG. 2 applies the summed current signal to each stage of Hamming distance calculation device 10, requiring a relatively large amount of current to flow in each reference current comparator stage. FIG. 4 is a schematic diagram of an alternative 3-bit Hamming determination embodiment that operates with lesser amounts of current within each stage by propagating a difference current to each stage instead of the full summed current signal where appropriate. The embodiment of FIG. 2 determines which reference current signal is to be compared with the summed current signal in each reference current comparator stage whereas the embodiment of FIG. 4 selects either the summed current signal or a difference current signal (summed current signal less reference current signal) as a drive current signal for comparison to a fixed reference current signal in a succeeding reference current comparator stage. In this manner, the amount of current propagating through the circuit is greatly reduced.

The Hamming distance calculation device 100 of FIG. 4 includes exclusive-or bit comparator 12, nonmatching current generator 14, and summing node S1 as previously described. First reference current comparator 18 receives the summed current signal from summing node S1 generated from nonmatching bit positions through current mirror transistors 34 and 36. The summed current signal is compared to reference current signal 4I from reference signal source 37 at node T1. The result of the comparison is latched by inverters 38 and 40 to produce output $O_1$ and drive a switching transistor 101 that determines whether the summed current signal is sent to second reference current comparator 20 from current mirror transistor 102 or a difference current signal, the difference between the summed current signal and the 4I reference current signal of a reference signal source 104, from node N1.

The drive current signal at node N1 is received at current mirror transistors 106 and 108 of second reference current comparator 20. The node N1 drive current signal is compared to a reference current signal of 2I from a reference signal source 110 at node N2. The result is latched by inverters 112 and 114 to produce output $O_2$ and drive a switching transistor 116 that determines whether the N1 node drive current signal from the current mirror transistor 118 or the difference between the N1 node drive current signal and the 2I reference current signal of a reference signal source 120 is sent to third reference current comparator 22 at node N3.

The drive current signal at node N3 is received at current mirror transistors 122 and 124 of third reference current comparator 22. The node N3 drive current signal is compared to a reference current; signal of I from a reference signal source 126 at node N4. The result is latched by inverters 128 and 130 to produce output $O_3$ and complete the illustrated 3-bit Hamming distance calculation.

Consider again an example of three nonmatching bit positions as determined by bit comparator 12. A current signal I is generated by nonmatching current generator 14 for each of the three nonmatching bit positions. The currents are combined to produce a summed current signal of 3I (plus an offset value to make accurate threshold comparisons) at summing node S1.

At first reference current comparator 18, the summed current signal of 3I is compared to reference current signal 4I from reference signal source 37 at node TI. Since the summed current signal is less than the 4I reference current signal, node TI is at a high level state resulting in a high level state at output $O_1$. A high level state at output $O_1$ turns off transistor 101, causing the summed current signal of 3I to propagate to second reference current comparator 20 through current mirror transistor 102 at node N1.

At second reference current comparator 20, the drive current signal at node N1 proceeds through current mirror transistors 106 and 108 to be compared with reference current signal 2I from reference signal source 110 at node N2. Since the node N1 drive current signal (carrying the summed current signal of 3I) is greater than the 2I reference current signal, node N2 is at a low level state resulting in a low level state at output $O_2$. A low level state at output $O_2$ turns on transistor 116, causing node N3 to have a drive current signal representing a difference of I between the node N1 drive current signal propagating through current mirror transistor 118 and the 2I reference current signal. The node N3 signal propagates to third reference current comparator 22.

At third reference current comparator 22, the node N3 drive current signal proceeds through current mirror transistors 122 and 124 for comparison with reference current signal I from reference signal source 126 at node N4. Since the node N3 drive current signal is greater than the I reference current signal due to the offset value, node N4 is at a low level state resulting in a low level state at output $O_3$. After inversion, outputs $\overline{O}_1$, $\overline{O}_2$, and $\overline{O}_3$ have the value 011 as shown in the graph of FIG. 3.

In summary, a Hamming distance calculation device performs an exclusive-or bit compare of two digital words to determine nonmatching bit positions. A nonmatching current generator creates a current signal for each nonmatching bit position and combines the current signals created into a summed current signal. The summed current signal drives a plurality of reference current comparators, each reference current comparator performing a separate threshold comparison of the summed current signal with a selected reference current signal. The outputs of the reference current comparators are inverted and applied to an analog-to-digital converter in order to create the digital output word indicating the Hamming distance between the two digital words.

Thus, it is apparent that there has been provided, in accordance with the present invention, a method and device for determining a Hamming distance between two multi-bit digital words that satisfies the advantages set forth above. Although the preferred embodiment has been described in detail, it should be understood that various changes, substitutions, and alterations can be made herein. For example, many of the direct connections illustrated herein could be altered by one skilled in the art such that two components are merely coupled to one another through an intermediate component or components without being directly connected as illustrated herein. Other examples are readily ascertainable by one skilled in the art and could be made without departing from the spirit and scope of the present invention as defined by the following claims.

What is claimed is:

1. A device for determining a Hamming distance between two multi-bit digital words, comprising:

circuitry for determining nonmatching bit positions of the two multi-bit digital words;

circuitry for generating a current signal for each nonmatching bit position, said current signal having a selected fixed current level, and a summed current signal from said generated current signals, said summed current signal having a current level representing the sum of said current signals;

circuitry for successively comparing said summed current signal with a plurality of reference current signals, said reference current signals being selected fixed current levels; and circuitry for converting results of said comparing circuitry into a digital representation of the Hamming distance between the two multi-bit digital words.

2. The device of claim 1, wherein said determining circuitry performs an exclusive-or function at each bit position of the two multi-bit digital words.

3. The device of claim 1, wherein said reference current signals are multiples of al base current signal, said base current signal corresponding to said current signal of each nonmatching bit position.

4. The device of claim 1, wherein said comparing circuitry selects a reference current signal for a succeeding comparison in response to a previous comparison of said summed current signal.

5. The device of claim 1, wherein said comparing circuitry is divided into a plurality of threshold stages according to a desired accuracy for the Hamming distance, each threshold stage having separate reference current signals to compare with said summed current signal.

6. The device of claim 5, wherein each threshold stage selects a reference current signal for a succeeding threshold stage.

7. The device of claim 5, wherein each threshold stage determines whether said summed current signal or a difference current signal drives a succeeding threshold stage, said difference current signal being a difference between said summed current signal and a corresponding reference current signal for a particular threshold stage.

8. A device for determining a Hamming distance between two multi-bit digital words, comprising:

a bit comparator for determining nonmatching bit positions of the two multi-bit digital words;

a current generator for generating a base current signal for each nonmatching bit position, said base current signal having a selected fixed current level, said current generator generating a summed current signal from said generated base current signals, said summed current signal including an offset value;

a first reference current comparator for performing a first comparison of said summed current signal to a first reference current signal; and a second reference current comparator for performing a second comparison of said summed current signal to a second reference current signal in response to said first comparison, said first and second current comparators providing a digital representation of the Hamming distance between the two multi-bit digital words.

9. The device of claim 8, wherein said first and second reference current signals are multiples of said base current signal.

10. The device of claim 8, wherein said first reference current comparator selects said second reference current signal for said second reference current comparator in response to said first comparison.

11. The device of claim 8, further comprising:

additional reference current comparators for increasing an accuracy of the Hamming distance determination, each reference current comparator comparing said summed current signals to a reference current signal selected by a previous comparison.

12. The device of claim 8, wherein said first reference current comparator determines whether said summed current signal or a first difference current signal drives said second reference current comparator in response to said first comparison, said first difference current signal being a difference of said summed current signal and said first reference current signal of said first reference current comparator.

13. The device of claim 8, further comprising:

additional reference current comparators for increasing an accuracy of the Hamming distance determination, each reference current comparator comparing a corresponding fixed reference current signal to a drive current signal selected from a previous comparison, said drive current signal being said summed current signal or a difference current signal generated by a previous comparison.

14. A method of determining a Hamming distance between two multi-bit digital words, comprising the steps of:

exclusive-or'ing the two multi-bit digital words to establish nonmatching bit positions;

generating a current signal for each nonmatching bit position, said current signal having a selected fixed current level;

summing the current signals of nonmatching bit positions into a summed current signal;

successively performing comparisons of the summed current signal to a plurality of reference signals, the reference signals being multiples of a base current signal, the base current signal corresponding to the current signal of a nonmatching bit position;

converting results of said successively performing step into a digital representation of the Hamming distance between the two multi-bit digital words.

15. The method of claim 14, further comprising the step of:

separating the reference signals into different threshold stages according to a desired accuracy for the Hamming distance.

16. The method of claim 14, further comprising the step of:

successively selecting a reference signal in response to previous comparisons of said successively performing step.

17. The method of claim 14, further comprising the step of:

determining whether the summed current signal or a difference current signal drives a succeeding comparison of said successively performing step, the difference current signal being a difference of the summed current signal and a specific reference current signal.

* * * * *